United States Patent [19]

McElroy

[11] 4,384,349
[45] May 17, 1983

[54] HIGH DENSITY ELECTRICALLY ERASABLE FLOATING GATE DUAL-INJECTION PROGRAMMABLE MEMORY DEVICE

[75] Inventor: D. J. McElroy, Houston, Tex.

[73] Assignee: Texas Instruments Incorporated, Dallas, Tex.

[21] Appl. No.: 155,039

[22] Filed: Jun. 2, 1980

Related U.S. Application Data

[60] Continuation-in-part of Ser. No. 80,712, Oct. 1, 1979, abandoned, and a continuation-in-part of Ser. No. 110,052, Jan. 7, 1980, which is a continuation-in-part of Ser. No. 923,876, Jul. 12, 1978, abandoned, which is a division of Ser. No. 762,613, Jan. 26, 1977, Pat. No. 4,151,021.

[51] Int. Cl.³ .............................................. G11C 13/00
[52] U.S. Cl. .................................... 365/218; 365/189
[58] Field of Search .......................... 365/218, 189, 230

[56] References Cited

U.S. PATENT DOCUMENTS 3,875,567 4/1975 Yamazaki et al. .................. 365/218
4,308,596 12/1981 Takai et al. ......................... 365/218

*Primary Examiner*—Terrell W. Fears
*Attorney, Agent, or Firm*—John G. Graham

[57] ABSTRACT

An improved electrically erasable semiconductor memory device of the N-channel, MOS, double level poly, programmable, read only memory or EPROM type is provided; the device is a very dense array of cells which may be electrically erased and programmed by dual injection into floating gates which are interposed between the channels and control gates. The electrical erasure or programming of the cells is accomplished by applying selected voltages to the source, drain, control gate and substrate to produce injection of electrons or holes. The avalanche breakdown voltage is increased by a high voltage on the row lines; the selected row line is grounded to allow erasure of a single bit or byte. The very dense array results from a simplified structure and manufacturing process which may be generally the same as prior N-channel floating gate EPROM technology.

27 Claims, 20 Drawing Figures

HIGH DENSITY ELECTRICALLY ERASABLE FLOATING GATE DUAL-INJECTION PROGRAMMABLE MEMORY DEVICE

RELATED CASES

This application is in part a continuation of my prior copending now abandoned application Ser. No. 080,712, filed Oct. 1, 1979, and further is in part a continuation of my prior copending application Ser. No. 110,052, filed Jan. 7, 1980, which was in part a continuation of my then-copending now abandoned application Ser. No. 923,876, filed July 12, 1978, which was a divisional of my then co-pending application Ser. No. 762,613, filed Jan. 26, 1977, now U.S. Pat. No. 4,151,021, all assinged to Texas Instruments.

BACKGROUND OF THE INVENTION

This invention relates to semiconductor memory devices and more particularly to an MOS ROM which is electrically programmable and electrically erasable.

Electrically programmable memory devices have been developed as shown in U.S. Pat. No. 3,984,822 which employ a floating gate in a double level polysilicon MOS ROM; for programming, the floating gate is charged by injection of electrons from the channel. Generally, however, this floating gate EPROM device is erased by exposing to ultraviolet light. Electrically erasable devices of MNOS type have employed charge storage on a nitride-oxide interface. Electrically alterable ROM's have been developed as set forth in U.S. Pat. No. 3,881,180, issued Apr. 29, 1975, and 3,882,469, issued May 6, 1975, as well as application Ser. No. 644,982, filed Dec. 29, 1975, all by W. M. Gosney and assigned to Texas Instruments; the Gosney devices are floating gate cells with dual injection (both holes and electrons) so that the gates may be charged or discharged. Other electrically alterable EPROM's are disclosed in U.S. Pat. Nos. 4,122,509 and 4,122,544 by Lawrence S. Wall or David J. McElroy, assigned to Texas Instruments. However, the prior cells have exhibited some undesirable characteristics such as large cell size, complex structure, process instability, process incompatible with standard techniques, high voltages needed for programming of erasure, etc.

It is therefore the principal object of the invention to provide improved electrically erasable semiconductor devices e.g., electrically alterable, programmable read-only-memory cells. Another object is to provide an electrically erasable memory cell which is of small cell size when formed in a semiconductor integrated circuit, particularly a dual injection type cell. A further object is to provide dense arrays of electrically erasable memory cells generally compatible with N-channel floating gate EPROM technology.

SUMMARY OF THE INVENTION

In accordance with one embodiment of the invention, an improved electrically erasable semiconductor memory device of the N-channel MOS double level poly, programmable read only memory of EPROM type is provided; the device is a very dense array of cells which may be electrically erased and programmed by dual injection into floating gates which are interposed between the channels and control gates. The electrical erasure or programming of the cells is accomplished by applying selected voltages to the source, drain, control gate and substrate to produce injection or electrons or holes. The avalanche breakdown voltage is increased by a high voltage on the row lines; the selected row line is grounded to allow erasure of a single bit or byte. The very dense array results from a simplified structure and manufacturing process which may be generally the same as prior N-channel floating gate EPROM technology.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

DETAILED DESCRIPTION OF SPECIFIC EMBODIMENT

Figure 1:
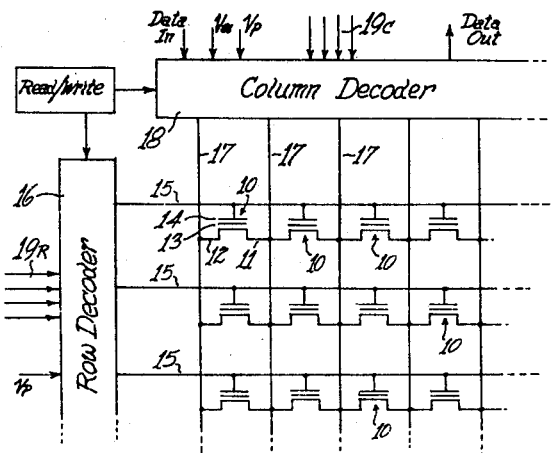
FIG. 1 is an electrical schematic diagram of an array of electrically erasable dual injection memory cells according to one embodiment of the invention.

Referring now to FIG. 1, an array of electrically erasable memory cells is shown according to one embodiment of the invention. Each cell is a floating gate transistor 10 having a source 11, a drain 12, a floating gate 13 and a control gate 14. All of the gates 14 in a row of cells are connected to a row address line 15, and all of the row address lines 15 are connected to a row decoder 16. All of the source and drain electrodes 11 or 12 in a column of cells are connected to a column line 17, and the source and drain column lines 17 are connected to one end to a column decoder 18. The column decoder functions to apply either a programming voltage $V_p$ (about +21 v), an avalanche or erase voltage Va (about +25 v), or a low voltage (ground or Vss, or Vbb, depending upon process), or a floating condition selectively to each source and drain column line 17, in response to read, program or erase commands and a column address on lines 19c, as well as a "0" or "1" data input. The row decoder 16 functions to apply a read voltage Vdd, a program voltage Vp, an erase voltage Vr, or a low voltage Vss (ground) to each of the row lines 15 in response to a row address on lines 19R and read, program or erase commands.

Figure 14:
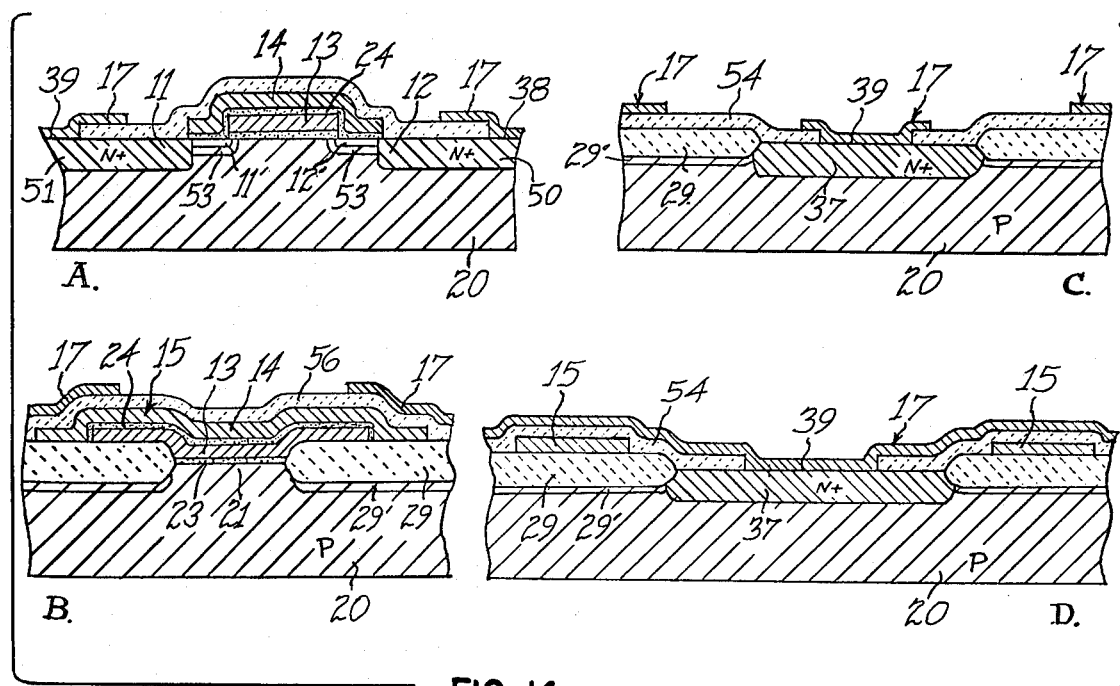
FIGS. 14a–14d are elevation views in section of the cells of FIG. 13, taken along the lines a—a, b—b, c—c, and d—d, respectively in FIG. 13.

For read, the device is operated as a standard ROM; the column decoder 18 grounds the line 17 to the right of the selected cell and connects a static load to the column line 17 on the left, using a decode arrangement as in FIG. 14 of U.S. Pat. No. 3,988,604, issued Oct. 26, 1976 to J. H. Raymond, assigned to Texas Instruments. The row decoder 16 applies a logic "1" or Vdd voltage to the selected row line 15 and applies a logic "0" or Vss to all other row lines 15.

Figure 2:
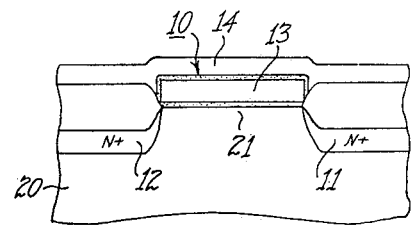
FIG. 2 is an enlarged sectional view of one of the memory cells in the array of FIG. 1.

The structure of one of the cells is seen in a greatly enlarged sectional view in FIG. 2. The cell is formed in a semiconductor substrate 20 which is P-type silicon for the N-channel floating gate MOS EPROM transistors herein described. The transistor 10 of the cell includes a channel region 21 between N+ type regions which are the lines 17 and also form the source 11 and drain 12. The channel region 21 lies beneath the floating gate 13 which is composed of phosphorus-doped polycrystalline silicon. The floating gate 13 is insulated from the underlying channel region 21 by a gate oxide layer 23 which is the original thermally-grown silicon oxide of a thickness of perhaps 500 angstroms. The control gate 14 is also composed of phosphorus-doped polycrystalline silicon extending over the floating gate 13 and functioning as the row line 15. The control gate 14 is isolated from the floating gate by a thermal oxide layer 24 which may be of about 1000 angstroms thick.

The cell is programmed by holding the source at programming voltage Vp, about +21 v., and the drain 12 at Vss while the control gate 14 is at Vp, whereupon the level of current through the channel 21 is such that the hot electrons are injected through the oxide 23 and charge the floating gate 13. Once charged, the floating gate stays in this condition indefinitely, and subsequently the apparent threshold voltage of the transistor is greatly increased, from perhaps +0.8 to +6 volts. To program only one cell in the virtual ground array of FIG. 1, the lines 17 to the right of the selected ground line are all held at Vss, and all the lines 17 to the left of the selected I/O line are held at Vp, so that only one cell in the selected row is subjected to programming conditions.

To erase a selected cell 10a, according to the invention, the selected row line 15a is held at Vss and all other row lines 15 are held at +Vr by the row decoder circuitry 16. A high voltage +Vr on the control gates 14 for these rows (see FIG. 2) functions to shift the field plate BVDSS (breakdown voltage, drain to source or substrate) to a higher value. Thus, in the selected row 15a the cells can exhibit avalanche breakdown at the drain-to-channel junctions at a lower voltage than in the non-selected rows. One column bias arrangement is to hold the selected column 17a at avalanche voltage Va, about +25 v, and all other columns 17 floating (or at an intermediate voltage such as about +20 v.) by means of the column decoder 18. This condition causes the drain-to-channel PN junction of the selected transistor 10a in reach avalanche breakdown and inject holes which are attracted toward the more negative (ground) control gate as well as attracted toward the negatively charged floating gate if the cell has been programmed. The holes will discharge the floating gate by recombining with electrons. As the floating gate discharges, the negative field decreases, and fewer holes traverse the gate oxide 23, so over-erasure is minimal. The cells in the selected column but non-selected rows will not be in an inadvertent program condition, even though they have high voltage on control gate and drain, because the source will be floating or at an intermediate voltage; thus, source-to-drain current is not high enough for electron injection. Avalanche current to the substrate injects holes.

In one example, the modulating effect of the voltage Vr of +25 v on the non-selected rows changes the BVDSS from about 25 v to about 40 v. It is understood that a negative charge on a programmed floating gate will also change the effective breakdown voltage by the value of this negative charge, perhaps −6 v., so in this example the non-selected rows would have a BVDSS of about 34 v. instead of 40 v.; this margin is still adequate, however. Preferably, the voltage Vr on the non-selected rows is about one threshold voltage Vt higher than the avalanche voltage Va applied to the selected column line 17, so Va would be about +24 v. The programming voltage in this example is about +20 v.

Figure 3:
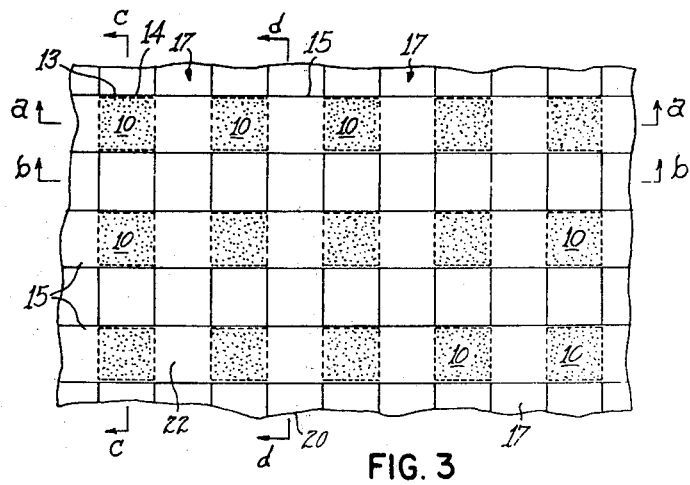
FIG. 3 is a plan view of a part of a semiconductor integrated circuit chip containing an array of the cells of FIGS. 1 and 2.

Referring now to FIG. 3, a part of the cell array of FIG. 1 is illustrated in plan view. FIGS. 4a to 4d are sectional views of the device of FIG. 3, as is FIG. 2, showing details of construction. The area shown in FIG. 3 is less than one mil square in size; the entire cell array may contain, for example, 65536 cells ($2^{16}$) or 131072 cells ($2^{17}$), or other power of two. The fifteen transistors 10 for the cells shown are created in five parallel elongated columns with thick field oxide 29 between the columns. N+ diffused regions 17 beneath the oxide 29 form interconnections between the cells and the sources and drains of the transistors, creating the column lines 17. Elongated parallel strips of polycrystalline silicon form the address lines 15 and the control gates 14 of the transistors. The floating gates 13 are buried beneath the strips 15. The simplified structure and manufacturing technique of this device allows the sources, drains, rows and column lines to be formed and interconnected in two non-critical masking operations with a very dense layout.

Turning now to FIGS. 5a–5e and 6a–6e, a process for manufacturing the devices described above will be explained. Note that FIGS. 5a–5e correspond to the sectional view of FIG. 4c in the finished device, that is to line c—c in FIG. 3, while FIGS. 6a–6e correspond to the sectional view of FIG. 4a, that is to the line a—a in FIG. 3.

Figure 4A:
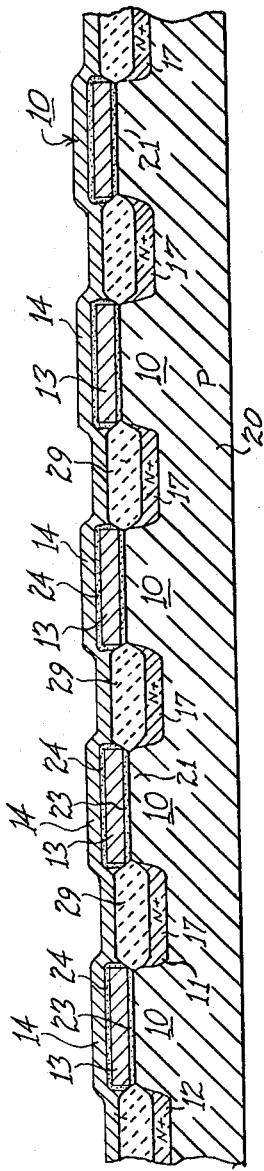
FIGS. 4a–4d are elevation views in section of the array of FIG. 3, taken along the lines a—a, b—b, c—c, and d—d respectively, in FIG. 3.
Figure 4B:
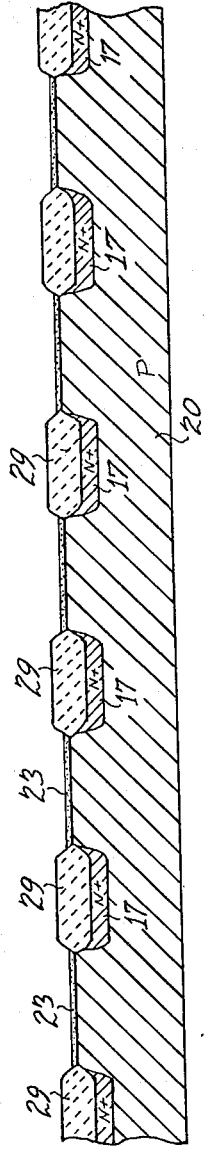
Figure 4C:
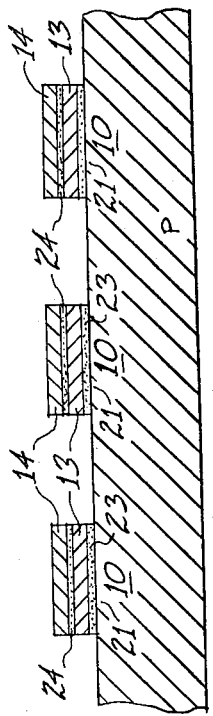
Figure 4D:
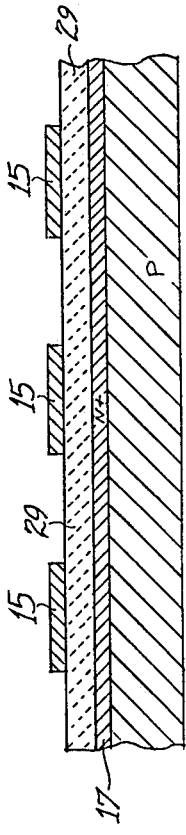
Figures 5, 6:
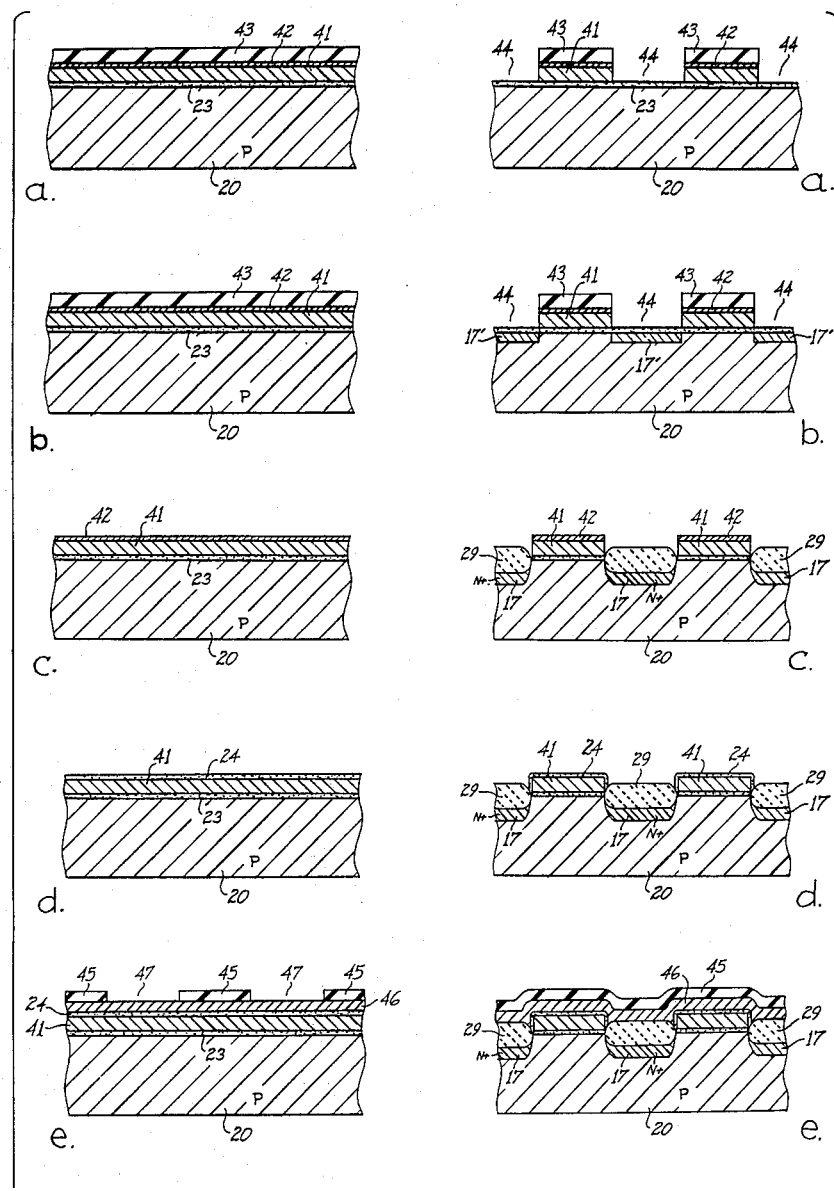
FIGS. 5a–5e are sectional views corresponding to FIG. 4c showing a cell according to one embodiment of the invention at various stages of manufacture.
FIGS. 6a–6e are sectional views corresponding to FIGS. 4a or 2 showing the array at successive stages of manufacture.

This is similar to an N-channel, silicon-gate, double level poly process for making MOS integrated circuit devices except that the first level poly is deposited at the beginning. The starting material is a slice of P-type monocrystalline silicon, perhaps 4 inches in diameter and 20 mils thick, cut on the <100> plane, of P-type conductivity doped with boron in growing to a resistivity of about 6 to 8 ohm-cm. In the FIGURES the wafer of body 20 represents a very small part of the slice, chosen as representative sample. First, after appropriate cleaning, the slice is oxidized by exposing to oxygen in a furnace at an elevated temperature of perhaps 1000° C. to produce an oxide layer 23 of a thickness of about 1000 angstroms; in contrast to prior methods, this layer 23 remains in the finished device as the gate oxide. Next, a layer 41 of polycrystalline silicon is deposited over the entire slice in a reactor using standard techniques, for example by decomposition of silane in hydrogen at about 930° C., to a thickness of about one-half micron, producing the polysilicon which will ultimately form the floating gates 13. The layer of poly is subjected to a phosphorus deposition and diffusion to render it highly conductive. The oxide 23 prevents this diffusion from penetrating the surface of the substrate 20 (except perhaps at poly to silicon contact areas on other parts of the slice, not shown). Then a layer 42 of silicon nitride of a thickness of about 1000 angstroms ($Si_3N_4$) is formed by exposing to an atmosphere of dichlorosilane and ammonia in a reactor. This three-layer sandwich is patterned in a plurality of parallel strips corresponding to the columns using a coating 43 of photoresist as a mask leaving areas 44 where nitride 42 and polysilicon 41 are etched away. An arsenic implant is performed, creating regions 17' in the silicon surface as seen in FIG. 6b; these regions will become the column lines 17 in the finished device. The photoresist 43 is removed, and the field oxide 29 is next grown by exposing the slice to a temperature of about 1100° C. in steam to produce about 3000 angstroms of thermal oxide, resulting in the structure seen in FIG. 4c. The implanted arsenic diffuses ahead of the oxidation front to create the column lines 17 beneath the field oxide 29. The nitride layer 42 is now removed by an etchant which attacks nitride but not silicon or silicon oxide, and the thin interlevel oxide 24 seen in FIGS. 5d and 6d is thermally grown by exposing the slice to an oxidizing atmosphere at high temperature. This oxide 24 covers all of the exposed surface of the first level polysilicon 41 which at this point is in the form of parallel strips. Next, a second layer 46 of polycrystalline silicon is deposited on top of the interlevel oxide 24 as seen in FIGS. 5e and 6e, and a coating 45 of photoresist applied over the second level poly. The photoresist 45 is exposed to light through a mask which is similar to that used to expose the photoresist 43 but rotated 90°, then developed to leave strips of photoresist which provide an etch mask having elongated holes 47 perpendicular to what were the first openings 44. Turning to FIGS. 4c an 4a, the next step is etching away the second level polysilicon 46, the oxide 24, and the first level polysilicon 41 in the openings 47. In this sequence of steps, no critical alignment of masks is needed. All four of the edges of the first level polysilicon floating gates are self-aligned, two with the edges of the second level polysilicon control gate strips and the other two with the strips of field oxide 29. The second level polysilicon 46 which remains after the second etching step creates the row lines 15 and control gates 14, while the remaining squares of first level polysilicon 41 create the floating gates 13. The N+ regions under the field oxide 29 are the column lines 17. In the device described above, made by the process of FIGS. 5 and 6, the series resistance and distributed capacitance of the lines 17 are such that programming is slow; techniques such as shown in my copending application Ser. No. 080,712, filed Oct. 1, 1979, may be used to enhance programming. That is, capacitive discharge of the distributed capacitance of the lines 17 in a series of pulses is employed to generate the programming current in the source-to-drain path of a selected cell 10.

Figure 7:
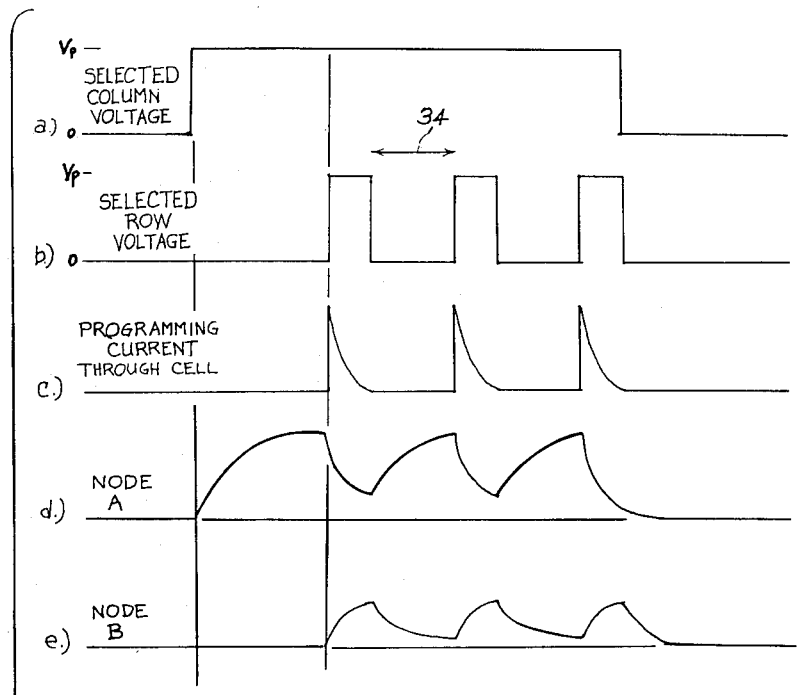
FIGS. 7a–7e are timing diagrams showing voltage or current as a function of time for the device of one embodiment of the invention, using a pulsed method of programming.
Figure 8:
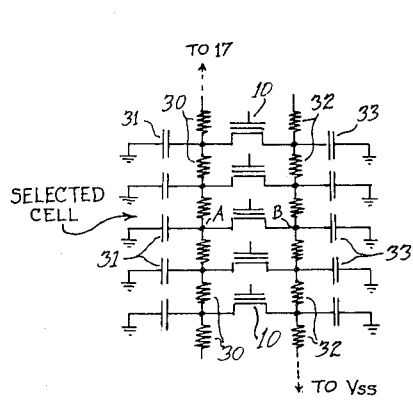
FIG. 8 is an electrical schematic diagram showing an equivalent circuit of the cell array of FIG. 1 using the programming method of FIGS. 7a–7e.

According to the features of Ser. No. 080,712, the cells are programmed by charging the distributed capacitance of the selected column line 17 for a time interval before the selected row line 15 is brought high. The resistance of the N+ regions which form the column lines 17 can be so high that the current in the channel 21 is not sufficiently high to program the cells efficiently using conventional methods. As shown in FIG. 7a, the Vp voltage on the selected line 17 goes high before the voltage goes high on the line 15, as seen in FIG. 7b. Thus the current to ground in the channel 21 of the selected cell will be a series of pulses as seen in FIG. 7c. The voltage at the source of a given cell is as shown in FIG. 7d; a finite time is required for the distributed capacitance of the N+ regions 17 to charge up through the series resistance of the elongated moat region. The selected column line 17 for output may be thought of as (for the 64K example) 256 series resistors 30 with a capacitor 31 at each juncture as seen in FIG. 8. The selected ground line is likewise a plurality of resistors 32 with capacitors 33. During each programming pulse of FIG. 7b, the capacitance 31 in the area of the cell can discharge through the selected channel 21 to charge the capacitor 33 on the ground side without the resistors 30 or 32 in series with the discharge path, whereas if the Vp voltage on the end of a column line were relied upon as in conventional devices then the drop across the series resistances would degrade the effectiveness of programming.

Several programming pulses are preferably used instead of only one. With the selected column line 17 held at Vp, as soon as the row line voltage (FIG. 7b) returns to Vss, the column line voltage causes the capacitance 31 to begin to charge again, while the capacitance 33 on the ground side will begin to discharge through the resistors 32, see FIG. 7e. Another pulse of FIG. 7b appears on the selected row line 15 after a time period 34 which allows the capacitor 31 to be near Vp and the capacitor 33 to be near Vss. The cycle is repeated as many times as needed for proper programming.

Figure 9:
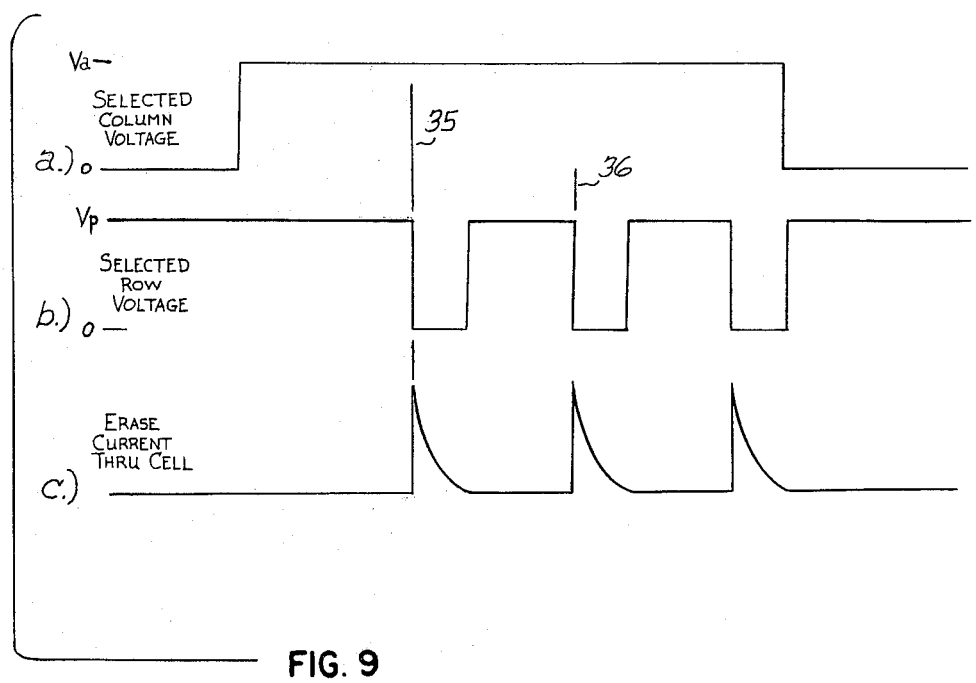
FIGS. 9a–9c are timing diagrams showing voltage or current as a function of time for the device of the embodiment of FIGS. 7a–7e and 8, using a pulsed method of erasing.

The same type of transient technique is used for erase as is described above for programming. Referring to FIG. 9a, the selected column line 17 is raised to Va, the avalanche voltage, while all of the row lines 15 are at a high voltage such as Vp as seen in FIG. 9b. The high voltage on the row lines prevents any of the cells from avalanching due to the modulating affect on breakdown voltage. Then, at time 35, the voltage for selected row line 15 is dropped to Vss, causing the breakdown voltage of the selected cell to be lower and thus allowing avalanche current to flow as seen in FIG. 9c. The nodes A and B will discharge and charge so avalanche conditions will not be sustained, but the row line voltage of FIG. 9b is raised to Vp again while the nodes A and B charge and discharge to Va and Vss, respectively, then the cycle repeats at time 36. In this manner, avalanche conditions can occur in spite of high series resistance in the lines 17.

In the virtual ground arrays described above, when a transistor 10a is erased (FIG. 1), an adjacent transistor 10b is also in avalanche conditions; the output decoding can be arranged such that adjacent pairs are in the same byte so byte erasability is employed instead of bit erasability.

Figure 10:
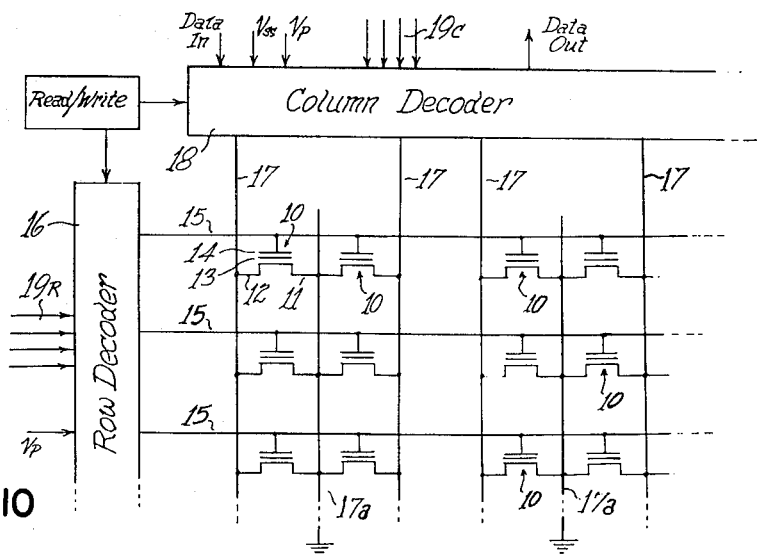
FIG. 10 is an electrical schematic diagram of an array of electrically erasable, dual injection cells, made by another embodiment of the invention similar to FIG. 1 but wherein dedicated ground lines are employed.
Figure 11:
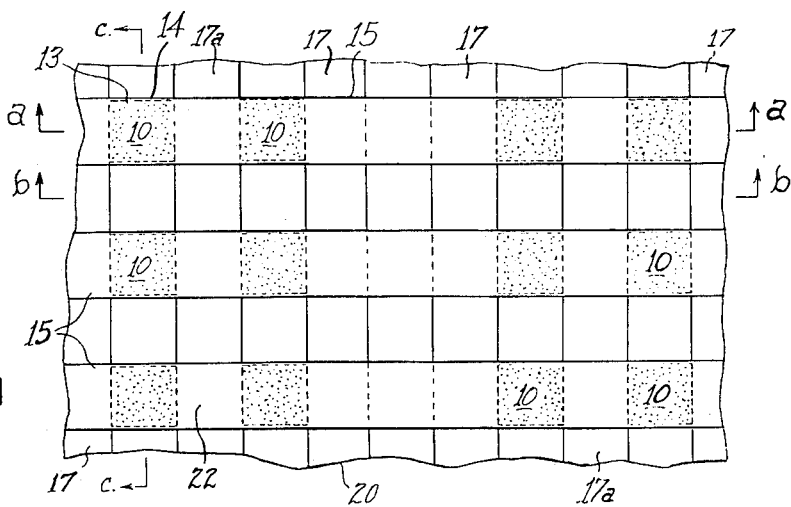
FIG. 11 is a plan view of a cell array according to the embodiment of FIG. 10.
Figure 12:
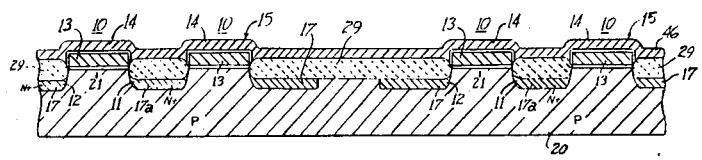
FIG. 12 is an elevation view in section of the device of FIG. 11, taken along the line 12—12 in FIG. 11.

It may be preferable to employ a conventional array as seen in FIG. 10 instead of a virtual ground array of FIG. 1. Dedicated ground lines 17a are provided between each pair of output lines 17. To produce this structure, the array of FIG. 3 is subjected to an additional mask and etch step using photoresist which allows every third column of cells 10 to be eliminated, resulting in the circuit of FIG. 10 and the structure of FIG. 11. To this end, after implanting the regions 17' of FIG. 6b, and before the field oxide growth of FIG. 6c, the additional mask and etch step removes the nitride 42 and underlying polysilicon 41 from every third column; the alignment of this mask is non-critical since it may overlap the areas 44 without detrimental effects. Where the nitride 42 is removed, the field oxidation step will grow oxide 29 and no cells 10 will subsequently be formed. However, no N+ implant is beneath this part of the field oxide so the adjacent column lines 17 on opposite sides will be isolated from one another. The resulting finished structure is seen in section in FIG. 12, which corresponds to FIG. 4a. When constructed in the manner of FIGS. 10, 11 and 12, the bit density of the array is reduced by one-third, but still the density is much greater than that of an EPROM made by the process of U.S. Pat. No. 3,984,822.

The EPROM thus far described utilizes polycrystalline silicon as the second level insulator, but another conductor such as aluminum could be used instead. Aluminum has the advantage of lower resistivity than polysilicon. The aluminum would be deposited and patterned by conventional process steps in place of the deposition and patterning of second level polysilicon described above. After the aluminum is etched, the then-exposed segments of oxide and poly would be removed by a different etchant.

The field oxide 29 of the device thus far described functions to reduce the capacitive coupling between the row address lines 15 and the column lines 17. The thickness of this field oxide is selected as a compromise between the reduced coupling factor and the enroachment of field oxide into the most areas which occurs for lengthy oxidation steps. Thus, perhaps 2000 or 3000 angstroms is optimum. If high capacitive coupling can be tolerated in the circuit design, e.g., in low speed devices, then the oxide 29 may be only about 1000 angstroms, in which case the nitride oxidation mask layer 42 is not needed; an arsenic implant produces the regions 17' after first level polysilicon is patterned (see FIG. 6b), and the oxide layer 29 is grown to perhaps 1000 angstroms during a diffusion or drive-in step at perhaps 1000° C., at which time a part of the surface of the first level polysilicon is also oxidized to create the interlevel oxide 24.

Figure 13:
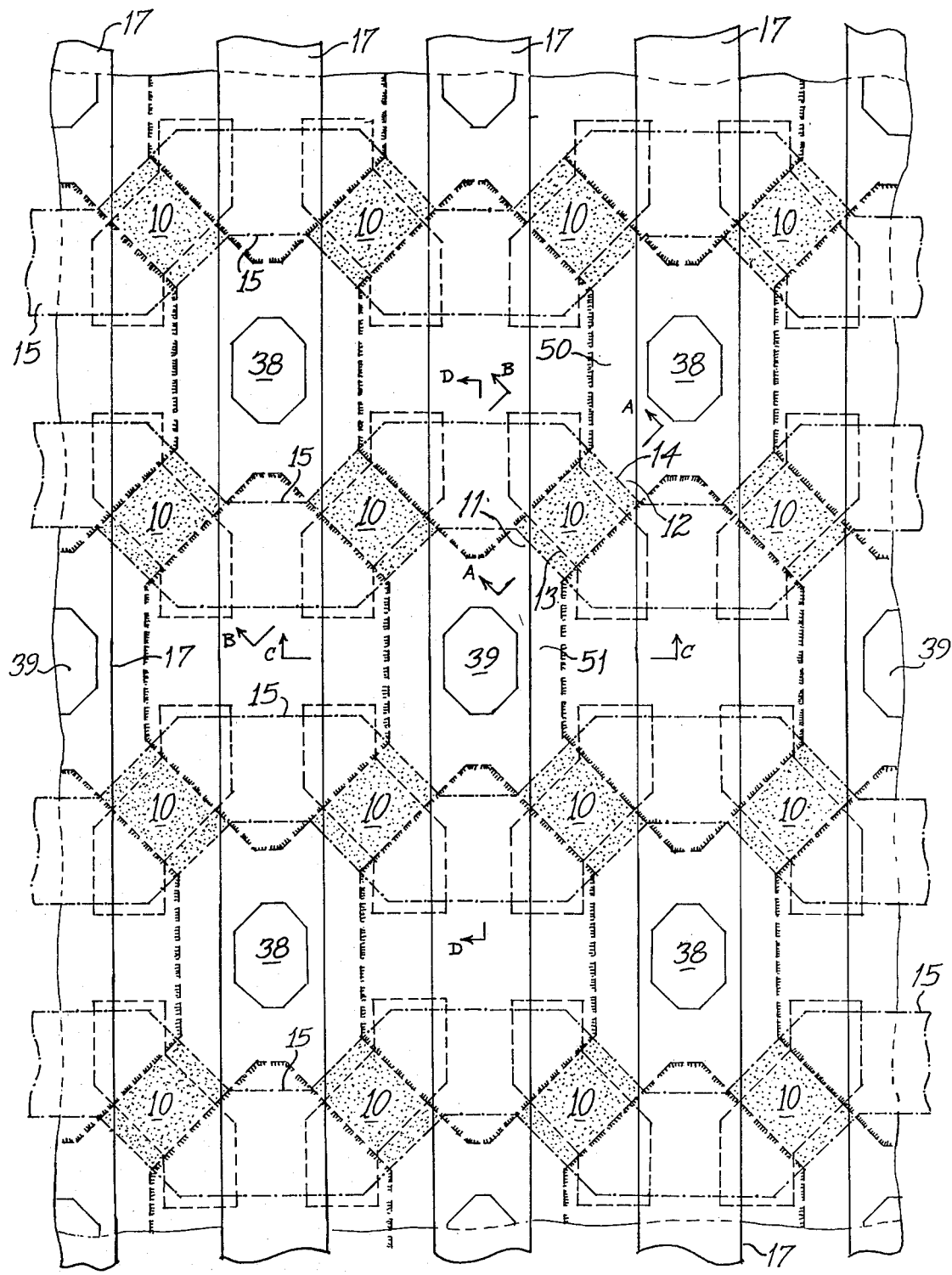
FIG. 13 is a greatly enlarged plan view of a small portion of a semiconductor chip showing the physical layout of a part of another virtual cell array made according to a different embodiment which may use the features of the invention.

Another embodiment of an EPROM cell array which may be electrically erased according to the invention is shown in FIGS. 13 and 14. In this embodiment alternate lines 17 are dedicated ground lines and the remaining alternate lines 17 are dedicated input/output lines. This type of "virtual ground" array is disclosed in copending applications Ser. No. 088,789, filed Oct. 29, 1979 and Ser. No. 118,348, filed Feb. 4, 1980, assigned to Texas Instruments. The small part of a cell array shown in FIG. 13 includes sixteen cells 10, four X address lines 15, and five metal strips 17 which form the dedicated Y output lines or dedicated ground lines. As seen in FIG. 13 and the sectional views of FIGS. 14a-14d, the source and drain regions 11 and 12 are formed by N+ diffused regions in a continuous web of "moat" area which also includes channel regions 21 between each source and drain and contact areas 38 and 39 for metal-to-moat contacts. The metal lines 17 contact the common N+ regions 50 of moat at contact areas 38 while the metal ground lines 17 contact common N+ regions 51 of the moat at areas 39. Each of the common regions 51 and 50 forms the sources or drains, respectively, of four of the transistors 10. The cell array is formed in a face of a silicon bar 20 as before, and a thick field oxide 29—covers all of this face except for the moat areas. P+ channel stop regions 29 underlie all field oxide in the usual manner. Shallow N+ arsenicimplanted regions 11' and 12' act as extensions of the source and drain regions 11 and 12 where the control gates overlap the floating gates, and P regions 53 formed by faster diffusing boron produces the programming efficiency advantages which were produced by the conventional P+ tank. A thin layer of gate oxide 23 insulates the floating gate 13 from the channel 21, and a thin oxide layer 24 insulates the floating gate 13 from the control gate 14. A thick layer of deposited interlevel oxide 54 separates the second level polysilicon which forms the X lines 15 and control gates 14 from the metal lines 17.

Turning now to FIGS. 15a-15e and 16a-16e, a process for manufacturing the devices of FIGS. 13 and 14 will be explained. Note that FIGS. 15a-15e correspond to the sectional view of FIG. 14a in the finished device, that is to line a—a in FIG. 13, while FIGS. 16a-16e correspond to the sectional view of FIG. 14b, that is to the line b—b in FIG. 13. This is basically an N-channel, silicon-gate, self-aligned, double level poly process for making MOS integrated circuit devices as set forth in copending application Ser. No. 072,504 filed Sept. 2, 1979, by Chiu and Lien, assigned to Texas Instruments. The starting material is a slice of P-type monocrystalline silicon as above. The slice is thermally oxidized to produce an oxide layer 61 of a thickness of about 1000 angstroms, and a layer 42 of silicon nitride of about 1000 angstroms is formed as before, but with no poly layer beneath it. A coating of photoresist is applied to the entire top surface, then exposed to ultraviolet light through a mask which defines the desired pattern, and developed. This leaves areas 62 where nitride is to be etched away; these are the areas where the filed oxide 29 is to be grown. The slice is subjected to a plasma etch, which removes the part of the nitride layer 42 not covered by the photoresist, but does not remove the oxide layer 61 and does not react with the photoresist.

The slice is now subjected to a boron implant into the areas 62 not covered by photoresist. Photoresist masks the implant. More heavily doped P+ regions 63 are thus produced in the surface. The photoresist is then removed.

As set forth in U.S. Pat. No. 4,055,444 issued to G. R. Mohan Rao, assigned to Texas Instruments, the slice is next subjected to a heat treatment at about 1000° C. for perhaps about two hours in an inert atmosphere such as nitrogen, causing the P+ regions 63 to penetrate deeper into the silicon surface and curing implant damage.

The next step is formation of field oxide 29, which is done by subjecting the slices to steam or an oxidizing atmosphere at about 900° C. for perhaps 10 hours. As seen in FIG. 16b, this causes a thick field oxide layer 29 to be grown, and this region extends into the silicon surface because silicon is consumed as it oxidizes. The nitride layer 42 masks oxidation beneath it. The thickness of this layer 29 is about 10,000 angstroms, part of which is above the original silicon surface and part below. The boron doped P+ regions 63 as previously implanted and modified by the $N_2$ anneal step will be partly consumed, but will also diffuse further into the silicon ahead of the oxidation front, producing the P+ channel stop regions 29'. The nitride layer 42 and its underlying oxide layer 61 are now removed by etching and another thin silicon oxide layer 23 of about 800 angstroms is grown over the exposed areas of silicon, producing the gate insulator.

A layer of polycrystalline silicon of about one-half to one micron thickness is deposited over the entire slice in a reactor using standard techniques, producing the polysilicon which will ultimately form the floating gates 13 and this layer of poly is subjected to a phosphorus deposition and diffusion to render it highly conductive.

Referring to FIGS. 15c and 16c, the polysilicon layer and the underlying gate oxide 23 are next patterned by applying a layer of photoresist, exposing to ultraviolet light through a mask, developing the photoresist image, and then etching, with the remaining photoresist masking certain areas of the polysilicon. The remaining part of the polysilicon layer provides what will be the floating gate 13 of one of the transistors 10.

The slice is next subjected to a blanket arsenic implant at about $10^{13}$ to $10^{14}$ per cm$^2$ which will create the implanted N regions 11' and 12'. Then, a boron implant at about $5 \times 10^{12}$ to $5 \times 10^{14}$ per cm$^2$ is performed to create the P-type regions 53. Another photoresist mask step covers areas where these implants are not wanted, if necessary. These two implants are both aligned with the first level poly gate 13 and underlying gate oxide 23. Boron will diffuse much faster than arsenic in a subsequent high temperature drive-in. The amount of drive-in is selected so that the boron doped regions 53 will have high enough boron doping to assist in hot electron injection into oxide, but the boron doped region is narrow enough to be punched through by the reversed biased voltage applied across the N+ to P junction.

The layer 24 of silicon dioxide is next grown on the first level polysilicon, producing a coating on all exposed surfaces of the poly, as seen in FIG. 15d, including tops and sides. As seen in FIGS. 15d and 16d, the second level polysilicon is next deposited over the entire top surface of the slice, covering the oxide layer 24. The second layer poly is patterned using photoresist to define the control gates 14 and the row address strips 15, then oxide layer 24 is etched away in all areas except under the strips 15. A deposition and diffusion operation into the moats produces the heavily doped N+ source and drain regions 11 and 12 as well as the N+ regions 50 and 51 under the contact areas 38 and 39 as seen in FIGS. 15e and 16e. The N+ diffused moat regions function as conductors which connect the various regions together, and also function as the source or drain regions. This diffusion also heavily dopes all the exposed polysilicon areas such as the control gates 14 and lines 15.

As seen in FIGS. 14a and 14b, fabrication of the device is continued by depositing a layer 54 of about 6000 angstroms of phosphorus-doped oxide by a low temperature reaction process using conventional chemical vapor deposition techniques. A photoresist operation opens windows in the oxide layer 54 in areas 38 and 39 where contact is to be made from metal to the N+ moat regions 50 and 51. A "densification" step may be used wherein the slice is heated at 1000° C. for the purpose of eliminating minute holes or pores in the oxide and smoothing out steps at contact locations. Then a layer of aluminum is deposited on the entire slice and patterned using photoresist masking to provide the metal lines 17, and various peripheral interconnections. A protective overcoat is deposited and patterned to expose bonding pads, the slice is scribed and broken into individual bars, and the bars packaged in the customary manner.

Figure 17:
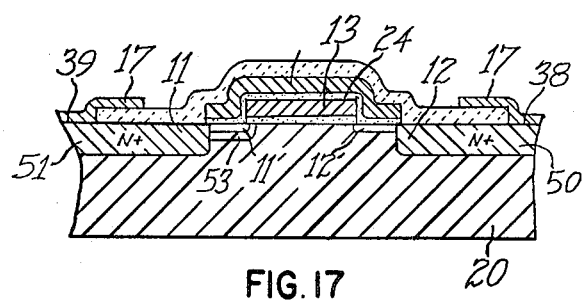
FIG. 17 is an elevation view in section of one cell of the cell array of FIG. 13 (corresponding to FIG. 14a) according to another embodiment of the invention.
Figures 15, 16:
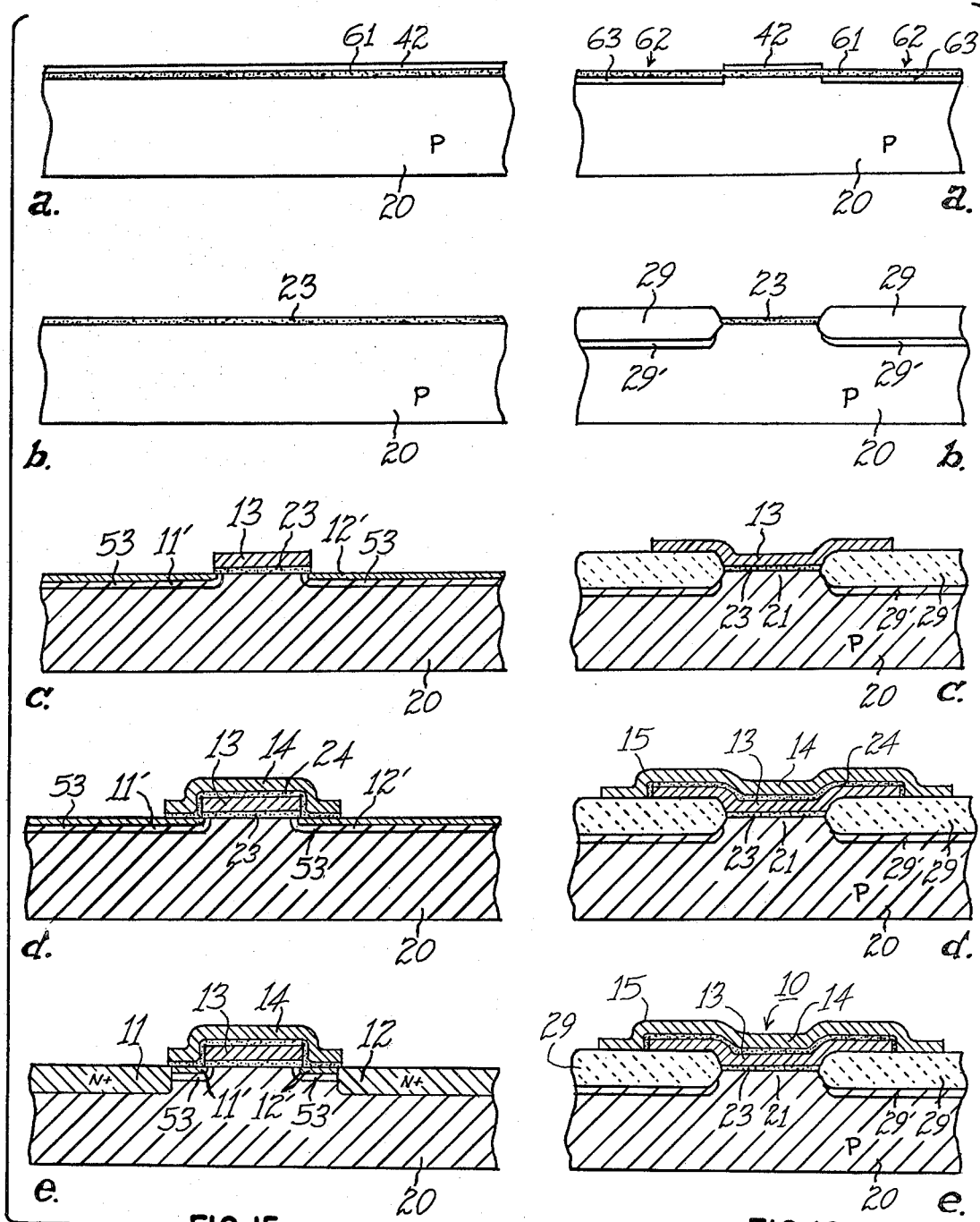
FIGS. 15a–15e and 16a–16e are elevation views in section of the cell array of FIGS. 13 and 14a–14d, at successive stages in the manufacturing process, taken generally along the lines a—a and c—c in FIG. 13.

In order to avoid an unintended erase condition in cells adjacent a selected cell in a virtual ground type of cell array such as that of FIG. 3 or FIG. 13, one side of a transistor can be constructed with a lower BVDSS than the other. That is, the source and drain junctions can be made different in characteristic. FIG. 17 is an example of such a structure wherein the drain 12' has a P+ region 53 and the source 11' does not. Otherwise the transistor 10 is exactly the same as in FIGS. 13-16. The drain in this case will avalanche at a much lower voltage than the source due to the P+/N+ diode at the drain 12' vs. the P−/N+ diode at the source 11'. This device of FIG. 17 is constructed by the same process as FIGS. 15a-15e and 16a-16e, except that a photoresist masking operation is employed for the boron implant of FIG. 15c where the region 53 is formed, limiting the implant to only one side instead of both sides.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of electrically erasing a selected memory cell in an array of memory cells; each cell being of the type having a source-drain path, a charge storage level and a control gate and functioning to read out logic-level voltage via selected voltages of logic-level on said control gate and source-drain path; comprising the steps of: applying an erase voltage to one end of the source-drain path of said selected cell; applying a low voltage to said control gate of the selected cell; and applying a high voltage to said control gates of non-selected cells in the array; said erase voltage and said high voltage both being higher than said logic-level voltage; said low voltage being lower than said erase voltage and high voltage.

2. A method according to claim 1, wherein said charge-storage level is a floating gate which is charged by electrons injected through a dielectric layer between said source-drain path and the floating gate and erased by holes injected through said dielectric layer.

3. A method according to claim 1 including the step of applying an electrically floating condition to the other and the source-drain path of said selected cell.

4. A method according to claim 1, wherein said erase voltage and said high voltage are greater than a programming voltage level for said cells.

5. A method according to claim 4 wherein said erase voltage produces avalanche breakdown at said one end of the source-drain path.

6. A method according to claim 5, wherein said high voltage raises the avalanche breakdown voltage of said non-selected cells to higher than said erase voltage.

7. A method of erasing a selected floating gate field effect transistor in an array of rows and columns of such transistors comprising:
   applying a low voltage to a selected row containing said selected transistor whereby the control gate of said selected transistor is at a low voltage to produce a first avalanche breakdown level;
   applying a high voltage to rows other than said selected row to raise the avalanche breakdown voltage of transistors in such other rows to a second avalanche breakdown level;
   applying an avalanche voltage to a selected one of said columns whereby one end of the source-to-drain path is at said first avalanche breakdown level.

8. A method according to claim 7, wherein the columns other than said selected column are floating.

9. A method according to claim 7, wherein the columns other than said selected column are at a voltage higher than said low voltage but lower than said high voltage.

10. A method according to claim 7, wherein said avalanche voltage is greater than a programming voltage for said transistors.

11. A method according to claim 10, wherein said low voltage is ground.

12. An electrically erasable floating gate type semiconductor memory array comprising: a plurality of field-effect transistor devices each having a source, a drain, a floating gate, and a control gate, the floating gate being isolated from the channel between source and drain by thin insulator and the control gate being isolated from the floating gate by thin insulator, the transistor devices being arranged in array of rows and columns, with the columns of transistor devices being the sources and drains connected to elongated parallel column lines; means connecting the control gates of all devices in each row together to provide row lines; said memory array functioning to read out logic-level voltage by selective application of logic-level voltage on the column lines and row lines;
   and erasing means comprising: means for applying an erase voltage to a selected one of the column lines; means for applying a high voltage to all said row lines except a selected row line; and means for applying a low voltage to said selected row line; said erase voltage and said high voltage being higher than said logic-level voltage, and said low voltage being lower than said high voltage.

13. A memory array according to claim 12, wherein said erase voltage produces avalanche breakdown in the transistor device in said selected row and selected column but in no other transistor devices in said array.

14. A memory array according to claim 13 wherein the avalanche breakdown of transistor devices in all rows except said selected row is raised to a higher level by said high voltage.

15. A memory array according to claim 14, wherein the transistor devices are N-channel and the floating gates and control gates are separate layers of polycrystalline silicon.

16. A memory array according to claim 14 wherein said column lines other than said selected one are electrically floating.

17. A method of erasing a memory cell of the type having a source-drain path, a floating gate and a control gate, comprising the steps of applying an avalanche voltage to one end of the source-drain path and connecting the other end to reference potential for a sufficient time to charge the capacitance of said one end to substantially said avalanche voltage while the voltage on said control gate is at a high potential to prevent avalanche, and thereafter applying a low voltage to said control gate to lower avalanche breakdown for said cell and cause injection and discharge of the floating gate.

18. A method according to claim 17 wherein said floating gate is erased by holes injected through a dielectric layer between said source-drain path and the floating gate when the transistor is in avalanche condition.

19. A method according to claim 18 wherein the time of first applying said low voltage to the control gate is after the time of first applying said avalanche voltage to the source-drain path.

20. A method according to claim 19 wherein a plurality of said cells are included in an array of rows and columns, and each column has a plurality of source-drain paths of cells connected between such column and a parallel column, and said step of applying avalanche voltage uses such column as a conductor.

21. A method according to claim 20 wherein each row is connected to said control gates of a plurality of said cells, and the step of applying a low voltages uses a row as a conductor.

22. A method according to claim 21 wherein said high potential and said avalanche voltage are much greater than threshold voltage for the cell.

23. An electrically erasable, electrically programmable semiconductor memory device comprising:
   an array of rows and columns of memory cells, each cell having a control gate connected by a row line to control gates of all cells in a row, each cell having a source-drain path connected to its ends to adjacent column lines, a floating gate between said source-drain path and control gate in each cell;
   the memory device functioning to read out logic-level voltage from the memory cells by selective application of logic-level voltage to the row and column lines;
   means for charging the capacitance of a selected one of the column lines to an erase voltage greater than said logic-level voltage over a time interval;
   means for maintaining the control gates of all cells in the array at a high level voltage greater than said logic-level voltage causing the source-drain paths to be in a non-erase condition during said time interval;
   and means for connecting a selected one of said row lines to a lower voltage at a time beginning after said time interval to cause discharging of the floating gate of one of the cells by carrier injection; said lower voltage being substantially less than said high level voltage.

24. A device according to claim 23 wherein said erase voltage and said high level both are much higher than the threshold voltage which turns on the source-drain path in a normal read operation.

25. A device according to claim 24 wherein said erase voltage is higher than a programming voltage for said cells.

26. A device according to claim 25 wherein means are connected to said column lines for coupling a column line adjacent said selected one to reference potential or to a floating condition.

27. A device according to claim 26 wherein said time interval is much greater than the cycle time of a normal read operation.

* * * * *